US010826012B2

(12) United States Patent
Choi

(10) Patent No.: US 10,826,012 B2
(45) Date of Patent: Nov. 3, 2020

(54) LIGHT-EMITTING DISPLAY DEVICE AND MANUFACTURING METHOD THEREOF

(71) Applicant: LG Display Co., Ltd., Seoul (KR)

(72) Inventor: Howon Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 41 days.

(21) Appl. No.: 15/994,555

(22) Filed: May 31, 2018

(65) Prior Publication Data

US 2018/0351126 A1 Dec. 6, 2018

(30) Foreign Application Priority Data

Jun. 2, 2017 (KR) .................. 10-2017-0069089

(51) Int. Cl.
*H01L 51/50* (2006.01)
*H01L 51/52* (2006.01)
*H01L 51/56* (2006.01)
*H01L 27/32* (2006.01)
(Continued)

(52) U.S. Cl.
CPC ....... *H01L 51/5036* (2013.01); *G09G 3/3291* (2013.01); *H01L 27/124* (2013.01); *H01L 27/3246* (2013.01); *H01L 27/3248* (2013.01); *H01L 27/3262* (2013.01); *H01L 51/5209* (2013.01); *H01L 51/5218* (2013.01); *H01L 51/5221* (2013.01); *H01L 51/5253* (2013.01); *H01L 51/5284* (2013.01); *H01L 51/56* (2013.01); *H01L 27/1248* (2013.01); *H01L 27/322* (2013.01); *H01L 51/5203* (2013.01); *H01L 51/5225* (2013.01); *H01L 51/5271* (2013.01); *H01L 2251/5315* (2013.01); *H01L 2251/5392* (2013.01)

(58) Field of Classification Search
CPC ... H01L 51/5206–5234; H01L 51/5218; H01L 27/3248; H01L 51/5203; H01L 51/5225
See application file for complete search history.

(56) References Cited

U.S. PATENT DOCUMENTS 9,590,177 B2 * 3/2017 Fang ................... H01L 27/3246
2008/0231168 A1 * 9/2008 Choi ................... H01L 27/3246
313/500

(Continued)

FOREIGN PATENT DOCUMENTS

KR   10-2008-0113782 A   12/2008
KR   10-2009-0001375 A   1/2009
(Continued)

*Primary Examiner* — Mohsen Ahmadi
(74) *Attorney, Agent, or Firm* — Seed Intellectual Property Law Group LLP

(57) ABSTRACT

The present disclosure provides a light-emitting display device including a lower substrate, a transistor, a planarization layer, a sacrificial layer, an isolation layer, a lower electrode layer, an organic emission layer and an upper electrode layer. The isolation layer is positioned on the sacrificial layer, and exposes part of the planarization layer through an opening that extends through the isolation layer and the sacrificial layer. The planarization layer includes a first contact hole positioned in the opening, and the lower electrode layer is electrically connected to one electrode of the transistor through the first contact hole.

17 Claims, 13 Drawing Sheets

(51) Int. Cl.
*H01L 27/12* (2006.01)
*G09G 3/3291* (2016.01)

(56) References Cited

U.S. PATENT DOCUMENTS

| | | | | |
|---|---|---|---|---|
| 2009/0212689 | A1* | 8/2009 | Lee | H01L 51/5209 |
| | | | | 313/504 |
| 2014/0361253 | A1* | 12/2014 | Choi | H01L 51/56 |
| | | | | 257/40 |
| 2016/0043341 | A1* | 2/2016 | Heo | H01L 27/3246 |
| | | | | 257/40 |
| 2016/0351846 | A1* | 12/2016 | Kim | H01L 51/5212 |
| 2017/0271418 | A1* | 9/2017 | Li | H01L 27/3246 |
| 2018/0301519 | A1* | 10/2018 | Ma | H01L 27/3211 |

FOREIGN PATENT DOCUMENTS

| | | | |
|---|---|---|---|
| KR | 10-2009-0002717 A | 1/2009 | |
| KR | 10-2016-0016339 A | 2/2016 | |
| KR | 10-2016-0072010 A | 6/2016 | |

* cited by examiner

OLED fills the void to prevent
cathode/PXL short-circuit t1 < t2 < t3
r1 < r2 < r3

LIGHT-EMITTING DISPLAY DEVICE AND MANUFACTURING METHOD THEREOF

This application claims the benefit of Korean Patent Application No. 10-2017-0069089, filed on Jun. 2, 2017, which is incorporated herein by reference for all purposes as if fully set forth herein.

BACKGROUND

Technical Field

The present disclosure relates to a light-emitting display device and a manufacturing method thereof.

Description of the Related Art

With the development of information technology, markets for display devices which are connection media between users and information are growing. Accordingly, various types of display devices such as a light-emitting display (OLED), a liquid crystal display (LCD) and a plasma display panel (PDP) are increasingly used.

Among the aforementioned display devices, the light-emitting display includes a display panel having a plurality of sub-pixels, a driver for driving the display panel, and a power supply for supplying power to the display panel. The driver includes a scan driver for supplying a scan signal (or gate signal) to the display panel and a data driver for supplying a data signal to the display panel.

The light-emitting display can display images in such a manner that light-emitting diodes of selected sub-pixels emit light when scan signals and data signals are supplied to sub-pixels. The light-emitting display is divided into a bottom emission type which emits light to a lower substrate and a top emission type which emits light to an upper substrate.

However, conventional light-emitting displays require a large number of masks in a manufacturing process and high manufacturing cost. Accordingly, it is desirable to simplify a light-emitting display manufacturing process and to improve product competitiveness.

BRIEF SUMMARY

In one or more embodiments, the present disclosure provides a light-emitting display device including a first substrate, a transistor, a planarization layer, a sacrificial layer, an isolation layer, a lower electrode layer, an organic emission layer and an upper electrode layer. The transistor is positioned on the first substrate. The planarization layer is positioned on the transistor. The sacrificial layer is positioned on the planarization layer. The isolation layer is positioned on the sacrificial layer, and part of the planarization layer is exposed by an opening that extends through the isolation layer and the sacrificial layer. The lower electrode layer is separated into a first portion positioned on the isolation layer and a second portion positioned on the planarization layer in the opening. The organic emission layer is positioned on the first and second portions of the lower electrode layer. The upper electrode layer is positioned on the organic emission layer. A first contact hole extends through part of the planarization layer in the opening, and the lower electrode layer is electrically connected to one electrode of the transistor through the first contact hole.

In another embodiment, the present disclosure provides a light-emitting display device including a display panel, an opening and a first contact hole. The display panel includes a plurality of sub-pixels, and each of the sub-pixels has a transistor and an organic light-emitting diode. The opening defines an emission area of a sub-pixel of the plurality of sub-pixels. The first contact hole is positioned in the opening, and one electrode of the transistor is electrically connected to a lower electrode layer of the organic light-emitting diode in the first contact hole.

In another embodiment, the present disclosure provides a method of manufacturing a light-emitting display device. The method of manufacturing a light-emitting display device includes: forming a transistor in a display area on a first substrate; forming a planarization layer on the transistor; forming a sacrificial layer on the planarization layer; forming an isolation layer on the sacrificial layer; forming an opening that extends through the isolation layer and the sacrificial layer; forming a lower electrode layer with a mask that exposes an overall surface of the display area aligned on the lower substrate; forming an organic emission layer on the lower electrode layer; and forming an upper electrode layer on the organic emission layer.

BRIEF DESCRIPTION OF THE SEVERAL VIEWS OF THE DRAWINGS

The accompany drawings, which are included to provide a further understanding of the disclosure and are incorporated on and constitute a part of this specification illustrate embodiments of the disclosure and together with the description serve to explain the principles of the disclosure.

DETAILED DESCRIPTION

Reference will now be made in detail to various embodiments of the disclosure, examples of which are illustrated in the accompanying drawings.

A light-emitting display device described below may be realized as a TV, a video player, a personal computer (PC), a home theater, a smartphone, etc. In addition, the light-emitting display device described below may be an organic light-emitting display device configured on the basis of an organic light-emitting diode (light-emitting element). However, the light-emitting display device described below may be configured on the basis of an inorganic light-emitting diode.

Figure 1:
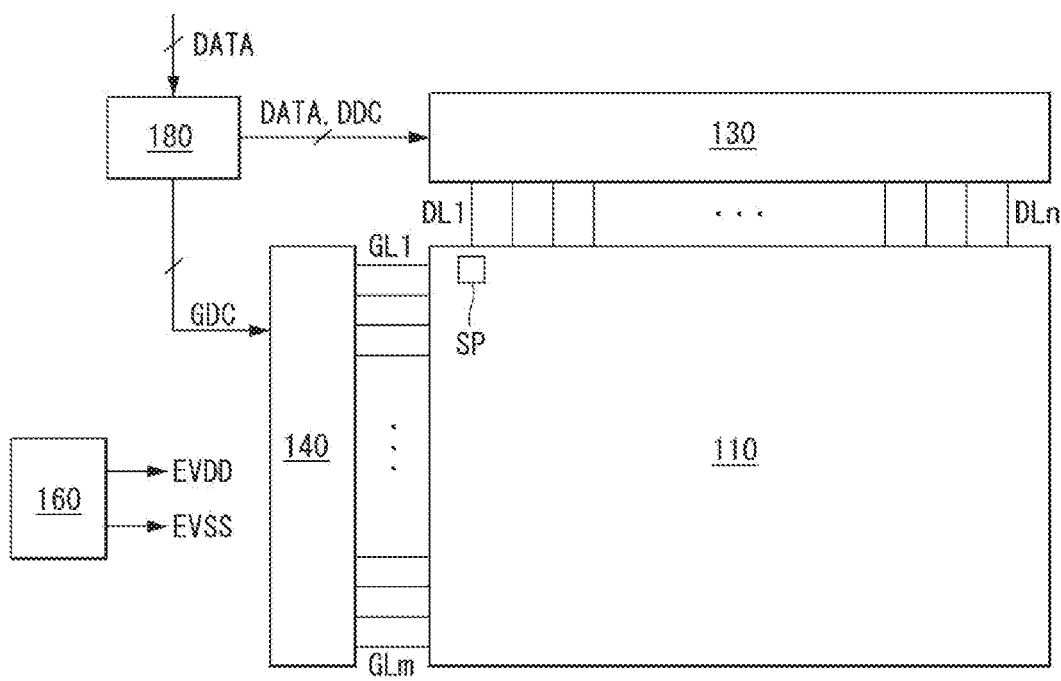
FIG. 1 is a schematic block diagram of an organic light-emitting display device.
Figure 2:
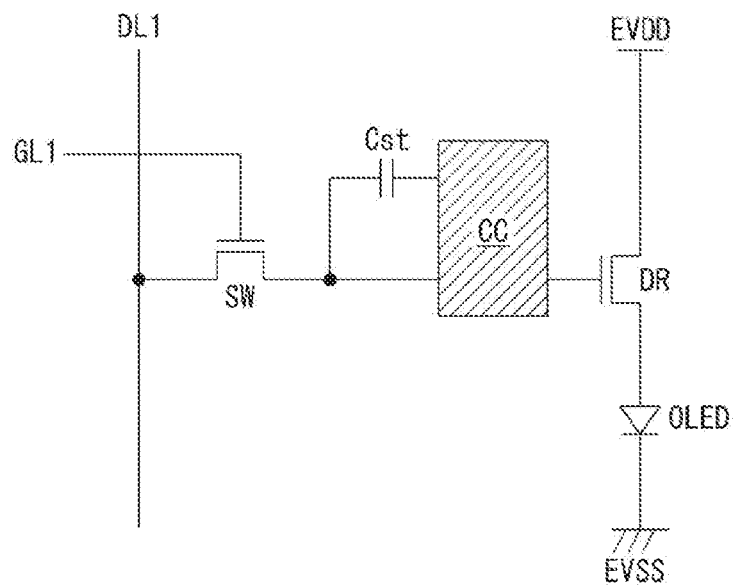
FIG. 2 is a schematic circuit diagram of a sub-pixel.
Figure 3A:
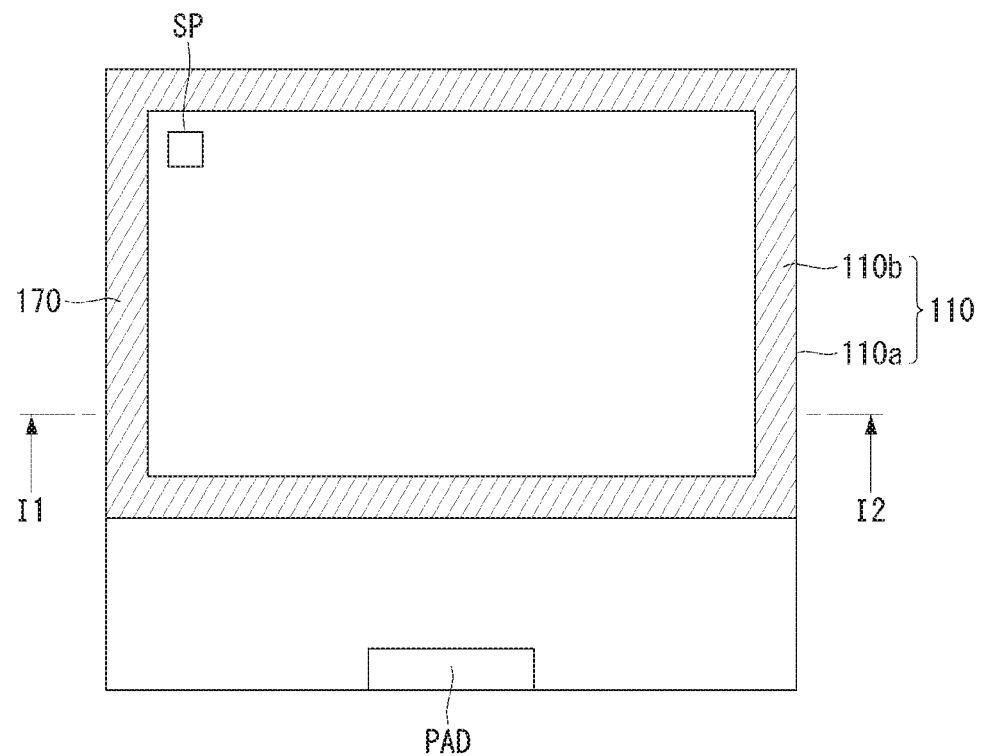
FIG. 3A is a diagram illustrating a top view of a display panel.
Figure 3B:
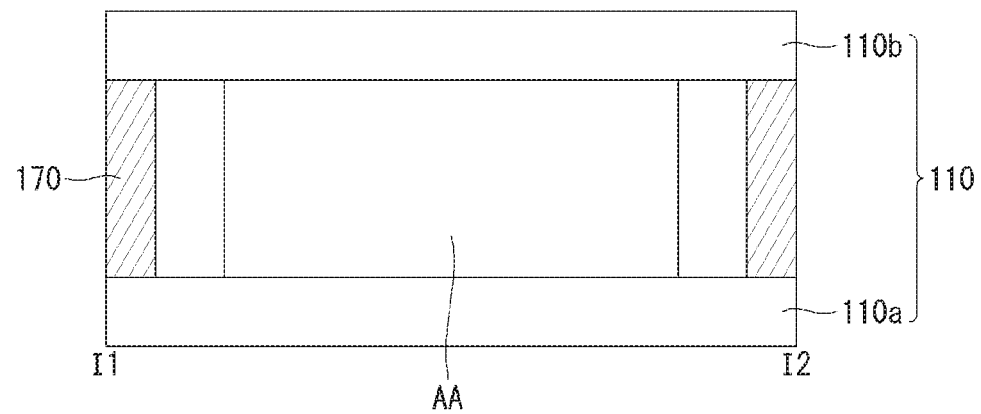
FIG. 3B is diagram illustrating a cross section of the display panel shown in FIG. 3A, taken along the line I1-I2.

FIG. 1 is a schematic block diagram of an organic light-emitting display device, FIG. 2 is a schematic circuit diagram of a sub-pixel and FIGS. 3A and 3B are diagrams illustrating a top view and a cross section, respectively, of a display panel.

As shown in FIG. 1, the organic light-emitting display device includes a timing controller 180, a data driver 130, a scan driver 140, a display panel 110 and a power supply 160.

The timing controller 180 receives a data signal DATA and driving signals including a data enable signal, a vertical synchronization signal, a horizontal synchronization signal, a clock signal and the like from an image processor (not shown). The timing controller 180 outputs a gate timing control signal GDC for controlling operation timing of the scan driver 140 and a data timing control signal DDC for controlling operation timing of the data driver 130 on the basis of the driving signals.

The data driver 130 samples and latches the data signal DATA supplied from the timing controller 180, converts the data signal DATA corresponding to a digital data signal into a gamma reference voltage corresponding to an analog data signal (or data voltage) and outputs the gamma reference voltage in response to the data timing control signal DDC supplied from the timing controller 180. The data driver 130 outputs the data signal DATA through data lines DL1 to DLn. The data driver 130 may be formed in the form of an integrated circuit (IC).

The scan driver 140 outputs a scan signal in response to the gate timing control signal GDC supplied from the timing controller 180. The scan driver 140 outputs the scan signal through scan lines GL1 to GLm. The scan driver 140 is formed in the form of an IC or formed in the display panel 150 through a gate-in-panel method (e.g., a method of forming a transistor through a thin film process).

The power supply 160 outputs a high voltage and a low voltage. The high voltage and the low voltage output from the power supply 160 are supplied to the display panel 110. The high voltage is supplied to the display panel 110 through a first power line EVDD and the low voltage is supplied to the display panel 110 through a second power line EVSS.

The display panel 110 displays an image on the basis of the data signal DATA supplied from the data driver 130, the scan signal supplied from the scan driver 140 and the power supplied from the power supply 160. The display panel 110 includes sub-pixels SP operating to display images and emitting light.

The sub-pixels SP include red, green and blue sub-pixels or white, red, green and blue sub-pixels. The sub-pixels SP may have one or more emission areas according to emission characteristics.

As shown in FIG. 2, a single sub-pixel includes a switching transistor SW, a driving transistor DR, a capacitor Cst, a compensation circuit CC and an organic light-emitting diode OLED.

The switching transistor SW performs a switching operation such that a data signal supplied through the first data line DL1 is stored as a data voltage in the capacitor Cst in response to a scan signal supplied through the first scan line GL1. The driving transistor DR operates such that a driving current flows between the first power line EVDD (high voltage) and the second power line (low voltage) according to the data voltage stored in the capacitor Cst. The organic light-emitting diode OLED serves to emit light according to the driving current generated by the driving transistor DR.

The compensation circuit CC is a circuit added to the sub-pixel in order to compensate for a threshold voltage of the driving transistor DR. The compensation circuit CC is composed of one or more transistors. The compensation circuit CC is configured in various manners according to a desired compensation method to be implemented by the compensation circuit CC. The compensation circuit CC may therefore be configured in various manners, depending for example on a desired application, and description of a particular configuration of the compensation circuit CC is omitted.

As shown in FIG. 3A and FIG. 3B, the display panel 110 includes a lower substrate 110a, an upper substrate 110b, a display area AA, a pad part PAD and a sealing member 170. The lower substrate 110a and the upper substrate 110b may be formed of a transparent resin or glass capable of transmitting light. The display area AA is composed of sub-pixels which emit light. The pad part PAD includes pads for electrical connection to an external substrate or circuit board.

The display area AA is arranged to occupy almost an entire surface of the lower substrate 110a and the pad part PAD is arranged at an edge of one side of the lower substrate 110a. The display area AA is sealed by the sealing member 170 interposed between the lower substrate 110a and the upper substrate 110b to be protected from moisture or oxygen. On the other hand, the pad part PAD may be exposed to the outside. However, the sealing structure of the display panel 110 may be realized in various manners and thus the present disclosure is not limited thereto.

Organic light-emitting display devices are divided into a bottom emission type which projects light to the lower substrate 110a and a top emission type which emits light to the upper substrate 110b.

However, conventional light-emitting display devices require a large number of masks in a manufacturing process and a high manufacturing cost. Accordingly, the present disclosure proposes structures described below in order to simplify a light-emitting display manufacturing process and improve product competitiveness.

Meanwhile, the following description is based on a top emission type light-emitting display device because top emission type light-emitting display devices can achieve various advantages compared to bottom emission type light-emitting display devices, and the advantages will be described later.

Figure 4:
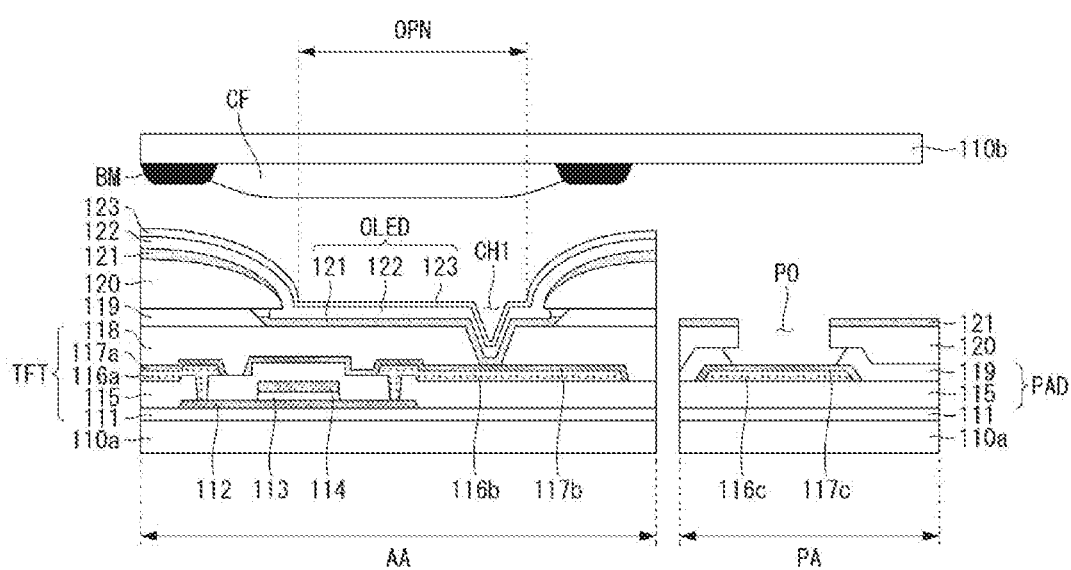
FIG. 4 is a cross-sectional view of a top emission type display panel according to a first embodiment of the present disclosure.
Figure 5A:
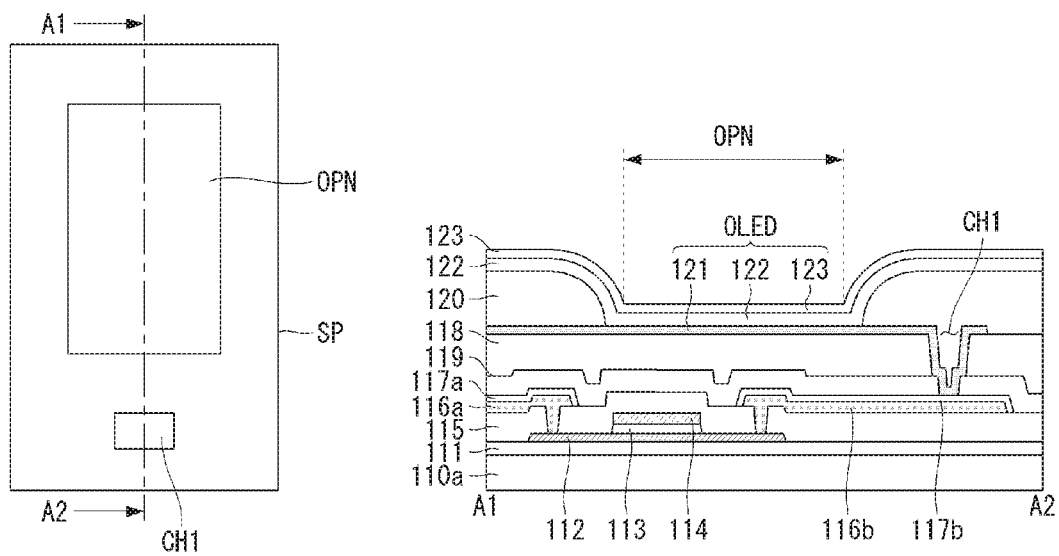
FIG. 5A is a diagram illustrating a top view and corresponding cross section view of a sub-pixel included in a conventional top emission type display panel, which is provided as a comparative example.
Figure 5B:
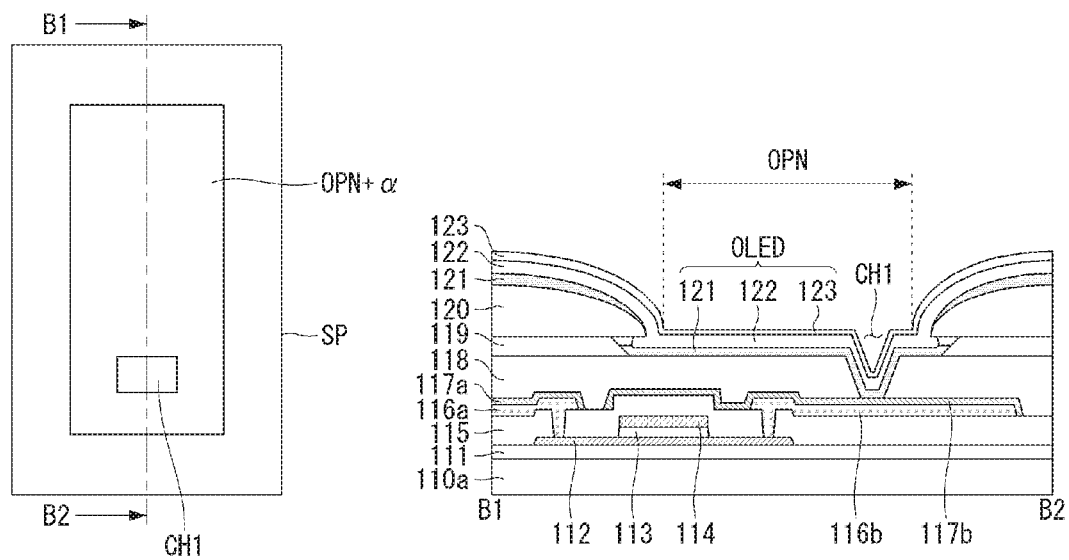
FIG. 5B is a diagram illustrating a top view and corresponding cross section view of a sub-pixel included in the top emission type display panel according to the first embodiment of the present disclosure.

FIG. 4 is a cross-sectional view of a top emission type display panel according to a first embodiment of the present disclosure and FIGS. 5A and 5B are diagrams for comparing a sub-pixel included in a conventional top emission type display panel (FIG. 5A) with a sub-pixel included in the top emission type display panel according to the first embodiment of the present disclosure (FIG. 5B).

As shown in FIG. 4, the top emission type display panel according to the first embodiment of the present disclosure may include a lower substrate 110a, a transistor TFT, an organic light-emitting diode OLED, a color filter CF, a pad part PAD, and an upper substrate 110b. The transistor TFT, the organic light-emitting diode OLED and the color filter CF are included in a display area AA and the pad part PAD is included in a pad area PA (or non-display area).

Hereinafter, structures formed between the two substrates 110a and 110b will be described. The cross-sectional structure of the display area AA corresponds to part of a single sub-pixel. In the following description, when a structure is formed on the overall surface of a substrate without being limited to the display area AA or the pad area PA, the areas are not defined.

A buffer layer 111 is positioned on the lower substrate 110a. The buffer layer 111 may be formed of a single layer of SiNx or SiOx or multiple layers of SiNx and SiOx. A light-shielding layer formed of a metal material to block external light may be positioned between the lower substrate 110a and the buffer layer 111. The light-shielding layer is disposed in an area corresponding to a semiconductor layer (or channel region) of the transistor.

A semiconductor layer 112 is positioned on the buffer layer 111. The semiconductor layer 112 is positioned in the display area AA and has a source region, a channel region and a drain region. The semiconductor layer 112 may be formed of an organic semiconductor material, an oxide semiconductor material or a silicon semiconductor material.

A gate insulating layer 113 is positioned on the semiconductor layer 112. The gate insulating layer 113 is formed to cover the channel region of the semiconductor layer 112 positioned in the display area AA. The gate insulating layer 113 may be formed of a single layer of SiNx or SiOx or multiple layers of SiNx and SiOx.

A gate metal layer 114 is positioned on the gate insulating layer 113. The gate metal layer 114 is formed having a size corresponding to the size of the gate insulating layer 113. The gate metal layer 114 becomes the gate electrode of the transistor TFT. In addition, the gate metal layer 114 is used as a metal layer forming scan lines. The gate metal layer 114 may be formed of one selected from a group consisting of Mo, Al, Cr, Au, Ti, Ni and Cu or an alloy thereof and may be formed as a single layer or multiple layers.

An interlevel insulating layer 115 is positioned on the gate metal layer 114. The interlevel insulating layer 115 may be formed of a single layer of SiNx or SiOx or multiple layers of SiNx and SiOx. The interlevel insulating layer 115 exposes the source region and the drain region of the semiconductor layer 112.

Data metal layers 116a, 116b and 116c are positioned on the interlevel insulating layer 115. The data metal layers 116a, 116b and 116c include first and second data metal layers 116a and 116b isolated and respectively connected to the source region and the drain region of the semiconductor layer 112 in the display area AA, and a third data metal layer 116c isolated and disposed in the pad area PA. The first and second data metal layers 116a and 116b become first and second electrodes of the transistor TFT and the third data metal layer 116c becomes an electrode of the pad part PAD. The data metal layers 116a, 116b and 116c may be formed of one selected from a group consisting of Mo, Al, Cr, Au, Ti, Ni and Cu or an alloy thereof and may be formed as a single layer or multiple layers.

Cover layers 117a, 117b and 117c are positioned on the data metal layers 116a, 116b and 116c. The cover layers 117a, 117b and 117c are patterned corresponding to the data metal layers 116a, 116b and 116c to cover and protect the data metal layers 116a, 116b and 116c which have been patterned to be electrically isolated from one another and disposed in the display area AA and the pad area PA. Differently from the first and third cover layers 117a and 117c, the second cover layer 117b is patterned to cover the channel region as well as the second data metal layer 116b. The cover layers 117a, 117b and 117c may be formed of an oxide such as ITO (Indium Tin Oxide) or IZO (Indium Zinc Oxide). In various embodiments, the cover layers 117a, 117b and 117c may be omitted or replaced by a passivation layer due to process characteristics. The passivation layer may be formed of a single layer of SiNx or SiOx or multiple layers of SiNx and SiOx.

A planarization layer 118 is positioned on the cover layers 117a and 117b. The planarization layer 118 may further be positioned on the cover layer 117c, or it may be omitted from over the cover layer 117c as shown in FIG. 4. The planarization layer 118 planarizes the surface of structures including the transistor TFT formed thereunder and thus is positioned in the display area AA. The planarization layer 118 may be formed of an organic material such as a negative overcoat, polyimide, benzocyclobutene series resin or acrylate and photoacrylate. The planarization layer 118 has a first contact hole CH1 exposing part of the second cover layer 117b (or part of the second data metal layer 116b) in an opening OPN that defines an emission area of a sub-pixel.

A sacrificial layer 119 is positioned on the planarization layer 118. The sacrificial layer 119 is positioned in the display area AA and the pad area PA. In the pad area PA, the sacrificial layer 119 may be positioned, for example, on the interlevel insulating layer 115. The sacrificial layer 119 positioned in the display area AA has an opening wider than the opening OPN defining the emission area of the sub-pixel. The sacrificial layer 119 positioned in the display area AA exposes part of the planarization layer 118 through the opening in the sacrificial layer 119 which is wider than the opening OPN. The sacrificial layer 119 positioned in the pad area PA has a pad open region PO that exposes part of the third cover layer 117c (or part of the third data metal layer 116c).

An isolation layer 120 is positioned on the sacrificial layer 119. The isolation layer 120 is positioned in the display area AA and the pad area PA. The isolation layer 120 positioned in the display area AA has the opening OPN defining the emission area of the sub-pixel. The isolation layer 120 positioned in the display area AA exposes part of the planarization layer 118 through the opening OPN. The isolation layer 120 positioned in the pad area PA defines the pad open region PO along with the sacrificial layer 119 positioned in the pad area PA. The isolation layer 120 may be formed of a silicon-group material, for example, siloxane.

A lower electrode layer 121 is positioned on the isolation layer 120. The lower electrode layer 121 is selected as an anode of an organic light-emitting diode OLED. The lower electrode layer 121 positioned in the display area AA is formed to cover the planarization layer 118 and the isolation layer 120. The lower electrode layer 121 positioned in the display area AA is electrically connected to part of the second cover layer 117b (or part of the second data metal layer 116b) through the first contact hole CH1 that extends through the planarization layer 118. The lower electrode layer 121 positioned in the display area AA has a structure in which the portion positioned on the planarization layer 118 is electrically isolated from the portion positioned on the isolation layer 120 due to an under-cut structure (or mushroom structure) where portions of the sacrificial layer 119 extend over the opening of the isolation layer 120. That is, the lower electrode layer 121 formed on the overall surface of the display area is divided into the portion positioned on the isolation layer 120 of the display area AA and the portion positioned on the planarization layer 118 exposed through the opening OPN and which extends beneath the isolation layer 120 in the under-cut structure.

According to the above-described structure and process, the portion of the lower electrode layer 121 positioned on the isolation layer 120 of the display area AA is electrically and physically isolated from the portion positioned on the planarization layer 118 exposed through the opening OPN. In the case of the lower electrode layer 121 positioned in the pad area PA, the lower electrode layer 121 is positioned on the isolation layer 120 and exposes the pad open region PO without having a portion disposed on the planarization layer 118.

In addition, the lower electrode layer 121 is isolated and formed in the opening OPN of each sub-pixel according to the under-cut structure even when a mask for exposing the overall surface of the display area (selectively including the pad area) (and masking areas other than the display area) is used instead of a mask for individually exposing each opening of the display area. That is, the lower electrode layer 121 is formed to be isolated as described above through batch deposition and has a shape distinguished from a shape formed through a mask process that individually exposes each opening of the display area. The batch deposition includes one-time deposition and multiple depositions.

Furthermore, even when a mask for exposing only openings and a mask for exposing only areas other than openings are respectively manufactured and the lower electrode layer 121 is formed by performing deposition twice using the masks, the shape of the lower electrode layer formed in this manner differs from the shape formed according to the under-cut structure. This is because the deposition method using the masks causes a deposition deviation between display panels according to degree of alignment but the under-cut structure does not cause a deviation according to degree of alignment. As a result, the lower electrode layer 121 is patterned on the isolation layer 120 and the exposed planarization layer 118 without an offset. Accordingly, the present disclosure can achieve uniform deposition and self-isolation of the lower electrode layer 121 to improve deposition uniformity and production yield.

Meanwhile, the under-cut structure which is formed due to the sacrificial layer 119 being recessed beneath portions of the isolation layer 120 forms a void between the upper surface of the planarization layer 118 and the lower surface of the isolation layer 120. That is, the under-cut structure has a void formed between upper and lower layers.

An organic emission layer 122 is positioned on the lower electrode layer 121. The organic emission layer 122 is formed of a material that emits white light but may be formed of a material that emits red, green or blue light according to circumstances or desired design (e.g., when a color filter is not provided).

An upper electrode layer 123 is positioned on the organic emission layer 122. The upper electrode layer 123 is selected as a cathode of the organic light-emitting diode OLED. The upper electrode layer 123 is formed to cover the overall surface of the organic emission layer 122 (e.g., to cover all sub-pixels). The upper electrode layer 123 is electrically connected to a second power line positioned in the display area AA or a non-display area. The lower electrode layer 121, the organic emission layer 122 and the upper electrode layer 123 form the organic light-emitting diode OLED. The sacrificial layer 119, the isolation layer 120, the lower electrode layer 121, the organic emission layer 122 and the upper electrode layer 123 positioned on the planarization layer 118 may be defined as an upper structure layer. The lower electrode layer 121, the organic emission layer 122 and the upper electrode layer 123 are positioned on the first contact hole CH1.

A color filter layer CF is positioned on the upper substrate 110b (e.g., on the side facing the lower substrate). The color filter layer CF contains a pigment that can convert light generated from the organic emission layer 122 into one of red, green and blue colors. The color filter layer CF is formed to occupy an area wider than the opening OPN defined on the lower substrate 110a.

A black matrix layer BM is positioned on the upper substrate 100b (e.g., on the side facing the lower substrate). The black matrix layer BM is positioned between neighboring color filters CF in order to block light leak at the boundary of sub-pixels (non-opening region) and to prevent color mixture of adjacent color filters CF. The black matrix layer BM contains a pigment in black.

A sub-pixel SP included in a conventional top emission type display panel has a structure in which an area for forming a first contact hole CH1 is isolated and spaced apart from an area for forming the opening OPN, as shown in the comparative example of FIG. 5A. On the other hand, a sub-pixel SP included in the top emission type display panel according to the first embodiment of the present disclosure has a structure in which an area for forming the first contact hole CH1 is included in the opening OPN, as shown in FIG. 5B.

In addition, as illustrated in FIG. 4, all of the lower electrode layer 121, the organic emission layer 122 and the upper electrode layer 123 are positioned in the first contact hole CH1 and thus they serve to emit light in addition to promoting electrical connection. Consequently, the aperture ratio of the sub-pixel SP included in the top emission type display panel according to the first embodiment of the present disclosure can be improved, compared to the conventional top emission type display panel (e.g., as shown in FIG. 5A), because the first contact hole CH1 can be disposed in the opening OPN. In addition, since the aperture ratio (emission area) is directly related to the life of the display device, the life of the sub-pixel SP included in the top emission type display panel according to the first embodiment of the present disclosure can be improved compared to the conventional top emission type display panel (e.g., as shown in FIG. 5A).

Hereinafter, characteristics with respect to the sub-pixel included in the top emission type display panel according to the first embodiment of the present disclosure will be additionally described.

Figure 6A:
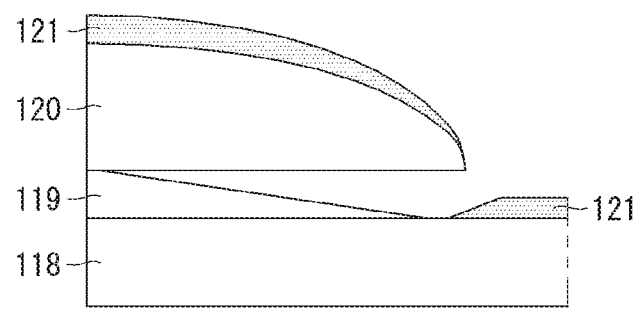
FIGS. 6A and 6B are diagrams for describing structural characteristics of the sub-pixel included in the top emission type display panel according to the first embodiment of the present disclosure.
Figure 6B:
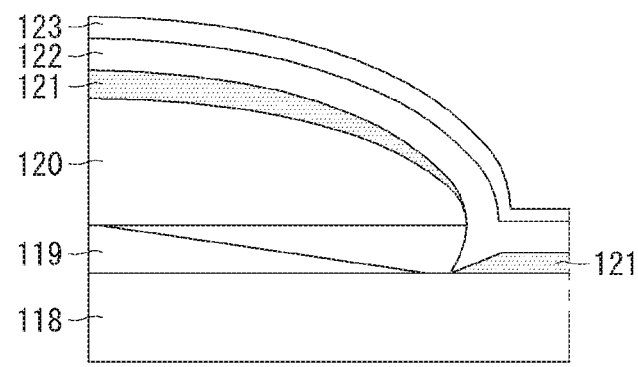
Figure 7:
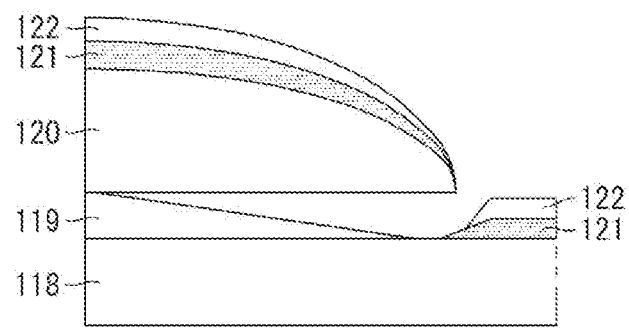
FIG. 7 is a diagram for describing characteristics with respect to the thickness of an organic emission layer.
Figure 8:
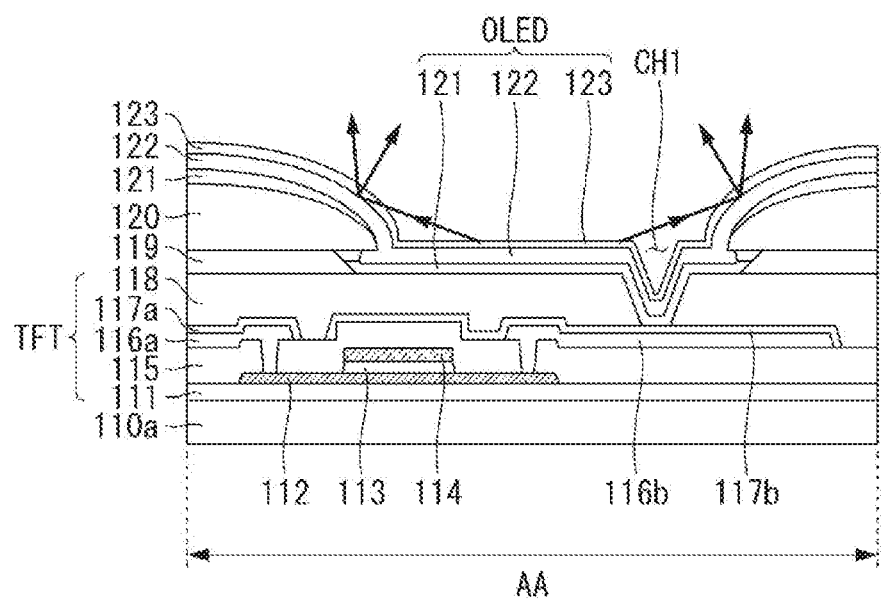
FIG. 8 is a diagram for describing characteristics with respect to deposited forms of an isolation layer and a lower electrode layer.
Figure 9A:
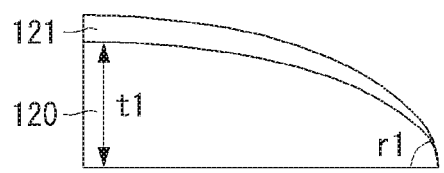
FIGS. 9A, 9B, and 9C are diagrams for describing characteristics with respect to structures of the isolation layer.
Figure 9B:
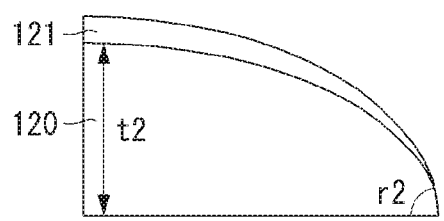
Figure 9C:
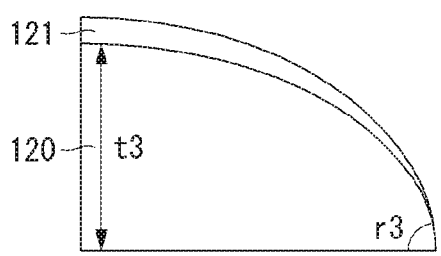

FIGS. 6A and 6B are diagrams for describing structural characteristics of the sub-pixel included in the top emission type display panel according to the first embodiment of the present disclosure and FIG. 7 is a diagram for describing characteristics with respect to the thickness of the organic emission layer. FIG. 8 is a diagram for describing characteristics with respect to deposited forms of the isolation layer and the lower electrode layer and FIGS. 9A, 9B, and 9C are diagrams for describing characteristics with respect to structures of the isolation layer.

As shown in FIGS. 4 and 6, the first embodiment of the present disclosure uses the sacrificial layer 119 and the isolation layer 120 when the top emission type display panel is manufactured. Particularly, the first embodiment of the present disclosure provides the under-cut structure formed by the sacrificial layer 119 recessed with respect to a portion of the isolation layer 120 that overlies the sacrificial layer 119.

The under-cut structure formed by the sacrificial layer 119 and the isolation layer 120 at least partially defines the opening and provides self-pixelation of sub-pixels such that the lower electrode layer 121 is isolated per opening OPN of each sub-pixel.

Consequently, the first embodiment of the present disclosure can omit formation of a bank layer and reduce the number of masks used when the top emission type display panel is manufactured to simplify the manufacturing process and decrease manufacturing cost.

It is desirable that the organic emission layer 122 have an appropriate thickness such that the portion thereof which covers the lower electrode layer 121 disposed on the isolation layer 120 in the under-cut region is connected to the portion covering the lower electrode layer 121 disposed in the opening OPN. One reason for this is described below.

The lower electrode layer 121 is formed through a thermal deposition process and thus may be formed even in a region under the isolation layer 120 (referred to as an under-cut region hereinafter) due to characteristics of the process. Since a portion of the lower electrode layer 121 formed in the under-cut region is insignificant, the thickness of the lower electrode layer 121 decreases in the under-cut region.

However, when the lower electrode layer 121 is formed even in the under-cut region, there is a high possibility of short-circuiting occurring between the lower electrode layer 121 and the upper electrode layer 123. Accordingly, it is desirable that the organic emission layer 122 have a thickness sufficient to at least partially fill the void of the under-cut region in order to preclude the possibility of short-circuiting occurring between the lower electrode layer (PXL) 121 and the upper electrode layer (cathode) 123. More particularly, the organic emission layer 122 may extend between a lower portion covering the lower electrode layer 121 in the opening OPN and an upper portion covering the lower electrode layer 121 on the isolation layer 120, so that the organic emission layer 122 separates the upper electrode layer 123 from the lower electrode layer 121 and thereby prevents a short circuit.

As shown in FIG. 7, the organic emission layer 122 may be formed on the portion of the lower electrode layer 121 which is disposed on the isolation layer 120 in the under-cut region and isolated from the portion of the lower electrode layer 121 formed in the opening OPN. That is, the organic emission layer 122 may be separated into a portion covering the lower electrode layer 121 formed on the isolation layer 120 and a portion covering the lower electrode layer 121 formed in the opening OPN.

Processing conditions may be set such that the portion of the organic emission layer 122 of the display area AA, which is formed in the opening OPN, is electrically and physically connected to (as shown in FIG. 6B) or disconnected from (as shown in FIG. 7) the portion formed outside the opening OPN. However, it is more advantageous that the portion of the organic emission layer 122 of the display area AA, which is formed in the opening OPN, is electrically and physically connected to the portion formed outside the opening OPN to preclude the possibility of generation of short-circuiting.

As shown in FIG. 8, the lower electrode layer 121 formed on the isolation layer 120 may serve to reflect light L emitted from the organic emission layer 122 to the upper substrate because the lower electrode layer 121 is formed on the isolation layer 120 and the isolation layer 120 is formed having a gradient toward the opening. That is, the isolation layer 120 has an upper surface that curves downwardly to an edge of the isolation layer 120, e.g., at an intersection of the curved upper surface and a lower surface of the isolation layer 120, at the opening formed through the isolation layer 120. The isolation layer 120 may have a shape (particularly, at a portion of the isolation layer 120 defining the opening) similar to a hemisphere in a cross-sectional view.

Accordingly, the first embodiment of the present disclosure can condense, reflect or directly project the light L emitted from the organic emission layer 122 depending on the shape of the surface of the isolation layer 120 and the material of the lower electrode layer 121 formed on the isolation layer 120, which are used when the top emission type display panel is manufactured. Therefore, the first embodiment of the present disclosure can selectively add one or more of the functions of condensing, reflecting and directly projecting emitted light to further improve display quality.

In addition, the isolation layer 120 corresponds to the non-opening region not the opening even in the display area. Accordingly, the lower electrode layer 121 is positioned only in the opening in the conventional display panel. However, according to the present disclosure, the lower electrode layer 121 is isolated and positioned in the non-opening region and the opening while being formed over the display area. Accordingly, the lower electrode layer 121 looks as if it is formed on the overall surface of the display area in a plan view.

As shown in FIGS. 9A to 9C, the thickness t1 to t3 of the isolation layer 120 and the angle of inclination toward the opening, r1 to r3, may be varied according to functions to be implemented. The thickness t1 to t3 and the inclination angle r1 to r3 illustrated in FIGS. 9A to 9C gradually increase from FIG. 9A to 9C. Functions and effects according to such thickness and inclination angle variations will be described below.

As a first example, the isolation layer 120 may be formed having a first thickness t1 and a first inclination angle r1, as shown in FIG. 9A, in consideration of the functions of reflecting and projecting the light emitted from the organic emission layer 122. As a second example, the isolation layer 120 may be formed having a second thickness t2 and a second inclination angle r2, as shown in FIG. 9B, in consideration of the functions of condensing, reflecting and projecting the light emitted from the organic emission layer 122. As a third example, the isolation layer 120 may be formed having a third thickness t3 and a third inclination angle r3, as shown in FIG. 9C, in consideration of the functions of condensing and reflecting the light emitted from the organic emission layer 122.

The thickness t1 to t3 and the inclination angle r1 to r3 of the isolation layer 120 may be varied as described above. According to such variation, the thickness of the portion of the lower electrode layer 121 formed at the top of the isolation layer 120 may differ from the thickness of the portion thereof formed at the edge (the end of the portion inclined toward the opening) of the isolation layer 120. Such a thickness difference of the lower electrode layer 121 (thickness difference between the portion of the lower electrode layer at the top of the isolation layer and the portion thereof at the edge of the isolation layer) may improve isolation (separation) of electrodes. For example, the portion of the lower electrode layer 121 formed at the edge of the isolation layer 120 may be thinner than the portion thereof formed at the top of the isolation layer 120. Alternatively, the thickness of the lower electrode layer 121 may decrease with increasing distance to the edge of the isolation layer 120 from the top of the isolation layer 120.

Hereinafter, a method of manufacturing the top emission type display panel according to the first embodiment of the present disclosure will be described.

FIGS. 10 to 18 are cross-sectional views for describing a method of manufacturing the top emission type display panel according to the first embodiment of the present disclosure. In the following, description of structures formed on the upper substrate will be omitted and structures formed on the lower substrate 110a will be described.

Figure 10:
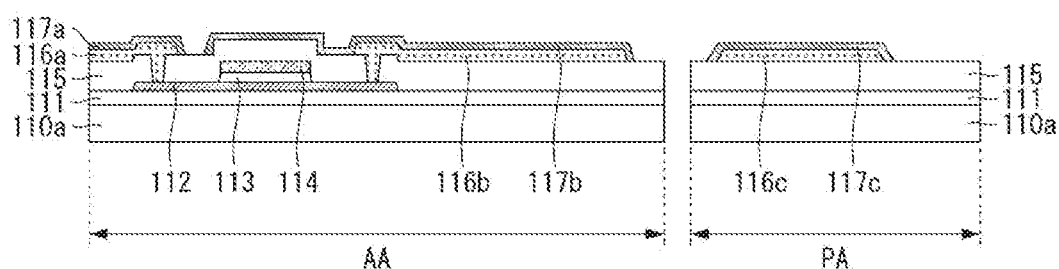
FIGS. 10 to 18 are cross-sectional views for describing a method of manufacturing the top emission type display panel according to the first embodiment of the present disclosure.

As shown in FIG. 10, the buffer layer 111 is formed on the lower substrate 110a. The buffer layer 111 may be formed of a single layer of SiNx or SiOx or multiple layers of SiNx and SiOx.

The semiconductor layer 112 is formed on the buffer layer 111. The semiconductor layer 112 is positioned in the display area AA and has the source region, the channel region and the drain region. The semiconductor layer 112 may be formed of an organic semiconductor material, an oxide semiconductor material or a silicon semiconductor material.

The gate insulating layer 113 is formed on the semiconductor layer 112. The gate insulating layer 113 is formed to cover the channel region of the semiconductor layer 112 positioned in the display area AA. The gate insulating layer 113 may be formed of a single layer of SiNx or SiOx or multiple layers of SiNx and SiOx.

The gate metal layer 114 is formed on the gate insulating layer 113. The gate metal layer 114 is formed having a size corresponding to the size of the gate insulating layer 113. The gate metal layer 114 becomes the gate electrode of the transistor TFT. In addition, the gate metal layer 114 is used as a metal layer forming scan lines. The gate metal layer 114 may be formed of one selected from a group consisting of Mo, Al, Cr, Au, Ti, Ni and Cu or an alloy thereof and may be formed as a single layer or multiple layers.

The interlevel insulating layer 115 is positioned on the gate metal layer 114. The interlevel insulating layer 115 may be formed of a single layer of SiNx or SiOx or multiple layers of SiNx and SiOx. The interlevel insulating layer 115 exposes the source region and the drain region of the semiconductor layer 112, e.g., by contacts holes formed through the interlevel insulating layer 115.

The data metal layers 116a, 116b and 116c are formed on the interlevel insulating layer 115. The data metal layers 116a, 116b and 116c include first and second data metal layers 116a and 116b isolated and respectively connected to the source region and the drain region of the semiconductor layer 112 in the display area AA, and a third data metal layer 116c isolated and disposed in the pad area PA. The first and second data metal layers 116a and 116b become first and second electrodes of the transistor TFT and the third data metal layer 116c becomes an electrode of the pad part PAD. The data metal layers 116a, 116b and 116c may be formed of one selected from a group consisting of Mo, Al, Cr, Au, Ti, Ni and Cu or an alloy thereof and formed as a single layer or multiple layers.

The cover layers 117a, 117b and 117c are formed on the data metal layers 116a, 116b and 116c. The cover layers 117a, 117b and 117c are patterned corresponding to the data metal layers 116a, 116b and 116c to cover and protect the data metal layers 116a, 116b and 116c which have been patterned to be isolated and disposed in the display area AA and the pad area PA. Differently from the first and third cover layers 117a and 117c, the second cover layer 117b is patterned to cover the channel region as well as the second data metal layer 116b. The cover layers 117a, 117b and 117c may be formed of an oxide such as ITO (Indium Tin Oxide) or IZO (Indium Zinc Oxide). The cover layers 117a, 117b and 117c may be omitted due to process characteristics.

Figure 11:
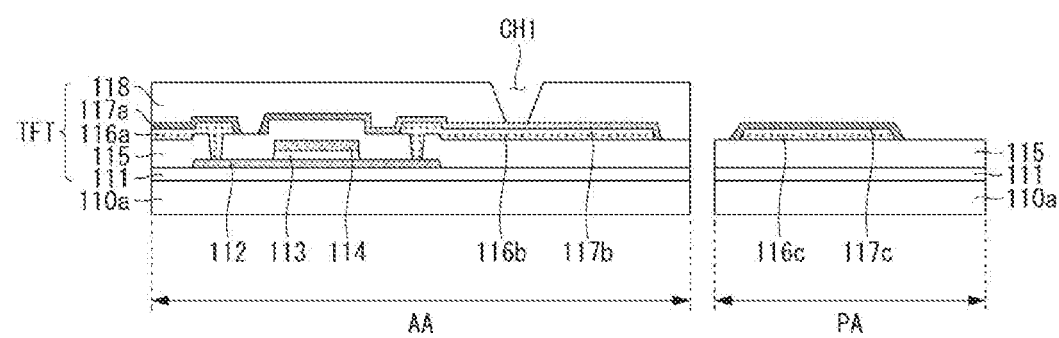

As shown in FIG. 11, the planarization layer 118 is formed on the cover layers 117a and 117b. The planarization layer 118 may further be positioned on the cover layer 117c, or it may be omitted from over the cover layer 117c, as shown in FIG. 11. The planarization layer 118 planarizes the surface of structures including the transistor TFT formed thereunder and thus is positioned in the display area AA. The planarization layer 118 may be formed of an organic material such as a negative overcoat, polyimide, benzocyclobutene series resin or acrylate and photoacrylate. The planarization layer 118 has a first contact hole CH1 exposing part of the second cover layer 117b (or part of the second data metal layer 116b) in the opening OPN that defines an emission area of each sub-pixel.

Figure 12:
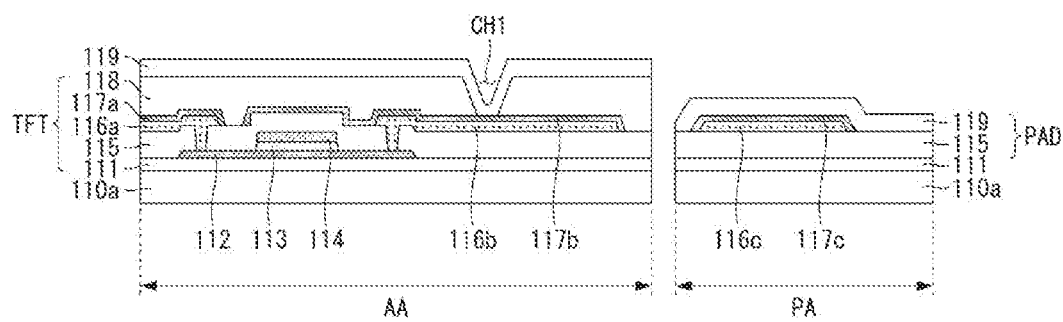
Figure 13:
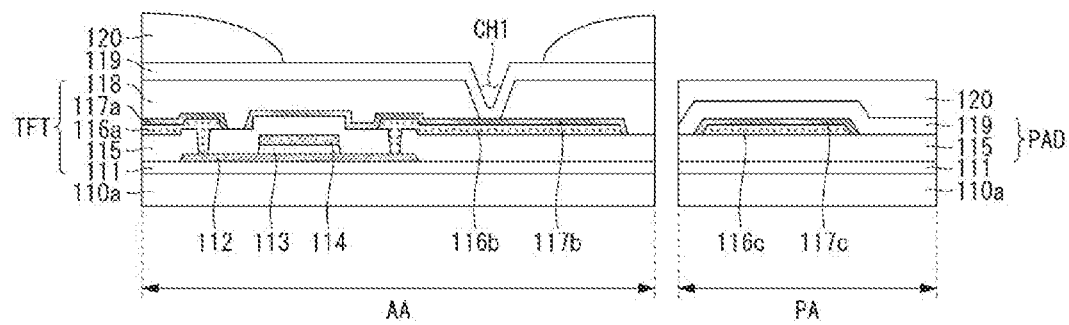
Figure 14:
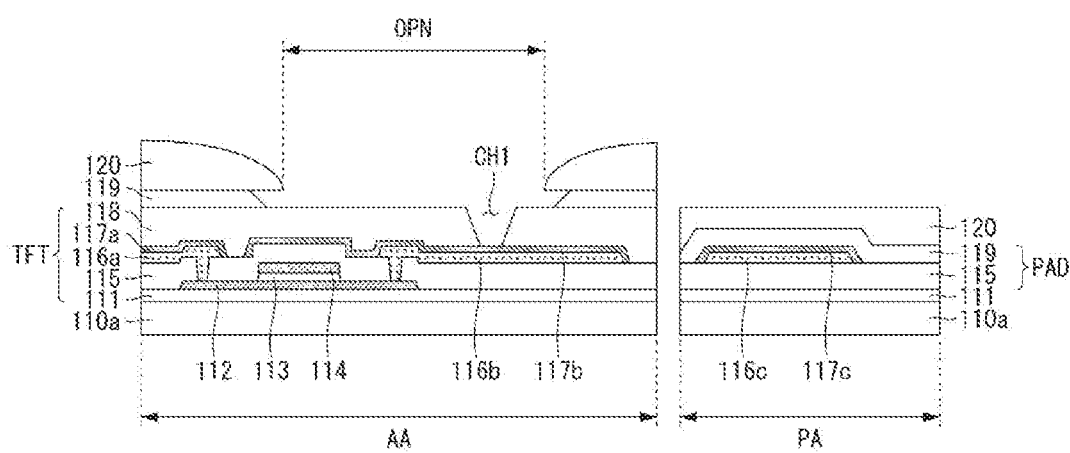

As shown in FIGS. 12 to 14, the sacrificial layer 119 and the isolation layer 120 are sequentially formed on the planarization layer 118. Then, the sacrificial layer 119 and the isolation layer 120 are patterned to be disposed in the display area AA and the pad area PA.

Through the above process, the sacrificial layer 119 positioned in the display area AA has an opening that is wider than the opening OPN defining the emission area of the sub-pixel. More particularly, the sacrificial layer 119 is recessed with respect to the edges of the isolation layer 120 that form the opening OPN, as shown in FIG. 14. The edge regions of the isolation layer 120 thus extend over the planarization layer 118 and form an undercut region where the sacrificial layer 119 is not present between the planarization layer and the isolation layer 120. The sacrificial layer 119 positioned in the display area AA exposes part of the planarization layer 118 through the opening wider than the opening OPN. The sacrificial layer 119 positioned in the pad area PA has the pad open region PO that exposes part of the third cover layer 117c (or part of the third data metal layer).

Through the above process, the isolation layer 120 positioned in the display area AA has the opening OPN defining the emission area of the sub-pixel. The isolation layer 120 positioned in the display area AA exposes part of the planarization layer 118 through the opening OPN. The isolation layer 120 positioned in the pad area PA defines the pad open region PO along with the sacrificial layer 119 positioned in the pad area PA (see e.g., FIG. 17). The isolation layer 120 may be formed of a silicon-group material, for example, siloxane.

Figure 15:
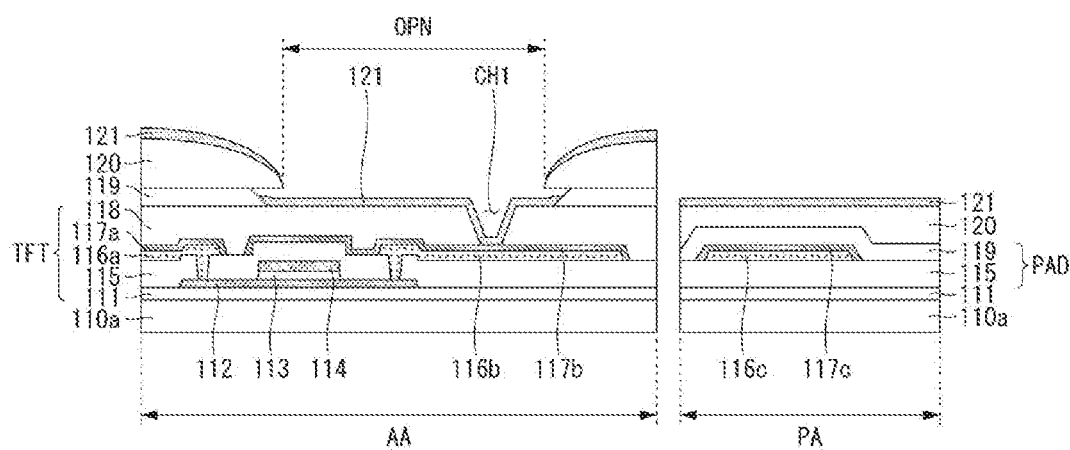

As shown in FIG. 15, the lower electrode layer 121 is formed on the isolation layer 120. The lower electrode layer 121 is selected as the anode of the organic light-emitting diode OLED. The lower electrode layer 121 positioned in the display area AA is formed to cover the planarization layer 118 and the isolation layer 120.

Figure 16:
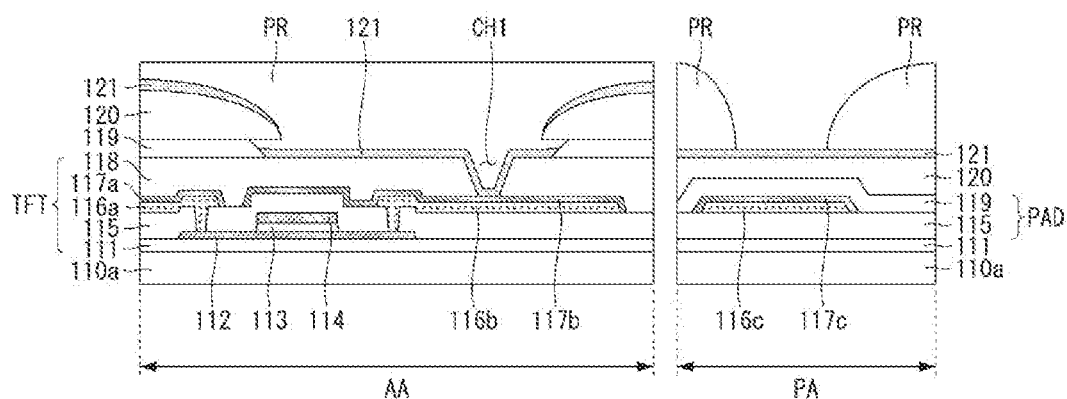
Figure 17:
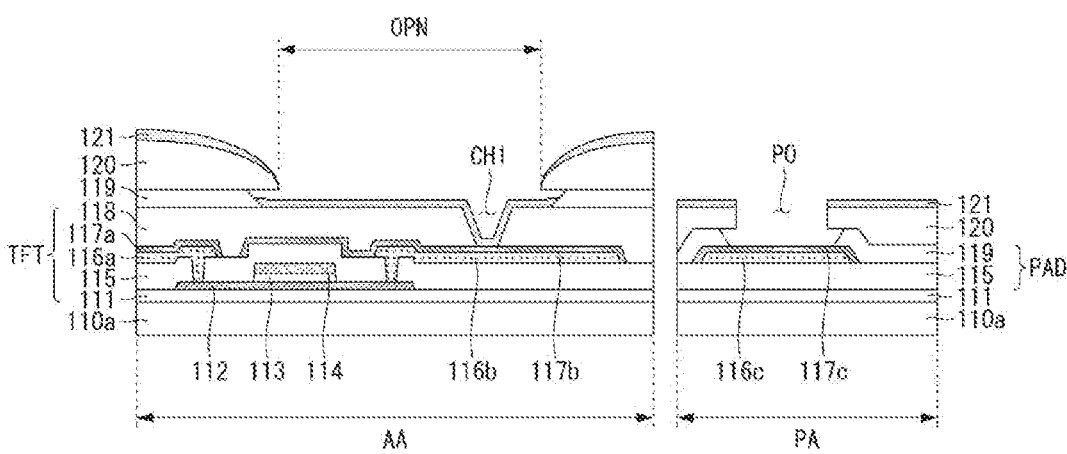

As shown in FIGS. 16 and 17, a photoresist PR is coated on the lower electrode layer 121 and patterned to expose the pad open region PO. Then, the photoresist pattern is removed.

Through the above process, the lower electrode layer 121 positioned in the display area AA is electrically connected to part of the second cover layer 117b (or part of the second data metal layer 116b) through the first contact hole CH1 of the planarization layer 118. The lower electrode layer 121 positioned in the display area AA has a structure in which the portion positioned on the planarization layer 118 is electrically isolated from the portion positioned on the isolation layer 120 according to the under-cut structure provided by the sacrificial layer 119 and the isolation layer 120. That is, the lower electrode layer 121 is divided into the portion positioned on the isolation layer 120 of the display area AA and the portion positioned on the planarization layer 118 exposed through the opening OPN. These portions are electrically isolated from each other. The lower electrode layer 121 positioned in the pad area PA exposes the pad open region PO although it is disposed on the isolation layer 120.

Figure 18:
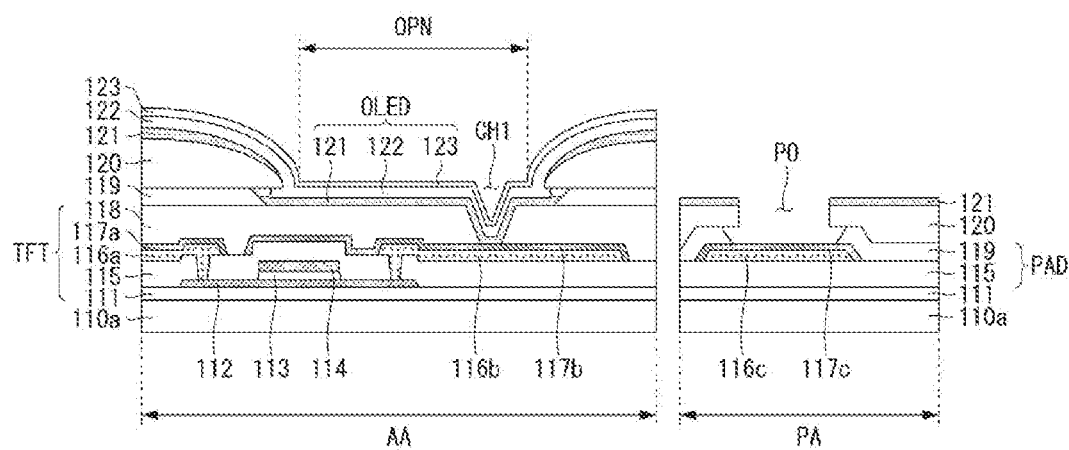

As shown in FIG. 18, the organic emission layer 122 is formed on the lower electrode layer 121. The organic emission layer 122 is formed of a material that emits white light but may be formed of a material that emits red, green or blue light according to circumstances (e.g., when a color filter is not provided).

The upper electrode layer 123 is formed on the organic emission layer 122. The upper electrode layer 123 is selected as the cathode of the organic light-emitting diode OLED. The upper electrode layer 123 is formed to cover the overall surface of the organic emission layer 122. The upper electrode layer 123 is electrically connected to the second power line positioned in the display area AA or the non-display area. The lower electrode layer 121, the organic emission layer 122 and the upper electrode layer 123 form the organic light-emitting diode OLED.

In the above-described first embodiment, the first contact hole CH1 is formed in the opening OPN. However, embodiments of the present disclosure may have a structure capable of condensing, reflecting or projecting the light emitted from the organic emission layer while maintaining the aperture ratio using the conventional structure. This will be described below.

Figure 19:
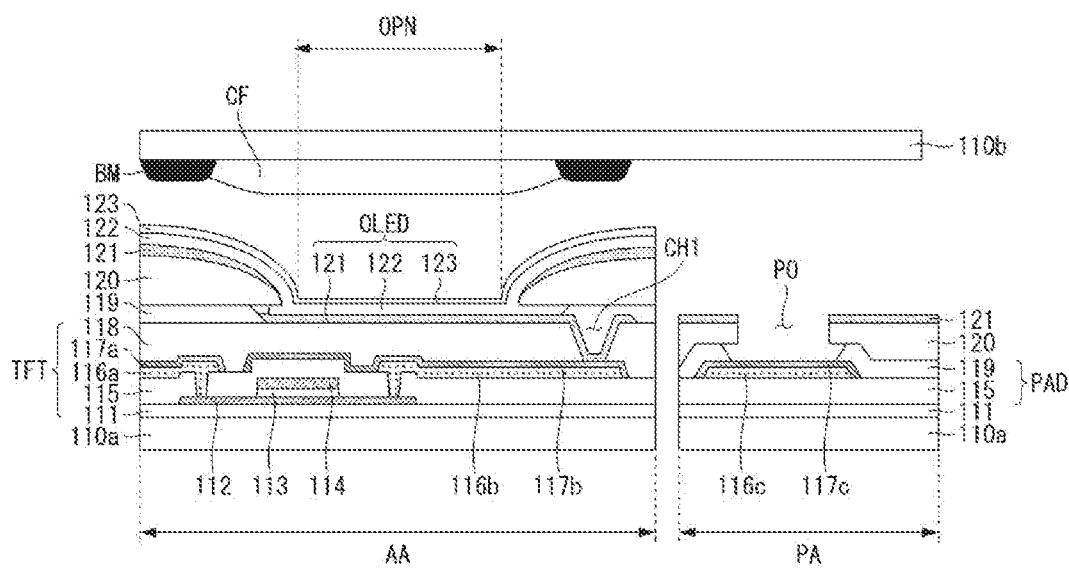
FIG. 19 is a cross-sectional view of a top emission type display panel according to a second embodiment of the present disclosure.

FIG. 19 is a cross-sectional view of a top emission type display panel according to a second embodiment of the present disclosure.

As shown in FIG. 19, the top emission type display panel according to a second embodiment of the present disclosure includes a transistor TFT, an organic light-emitting diode OLED, a color filter CF, a pad part PAD and the upper substrate 110b. The transistor TFT, the organic light-emitting diode OLED and the color filter CF are included in the display area AA and the pad part PAD is included in the pad area PA (or non-display area).

Structures formed between the two substrates 110a and 110b will be described below. Here, the cross section corresponding to the display area AA shows part of a single sub-pixel. In the following description, when a structure is formed on the overall surface of a substrate without being limited to the display area AA or the pad area PA, the areas are not defined.

The buffer layer 111 is positioned on the lower substrate 110a. The buffer layer 111 may be formed of a single layer of SiNx or SiOx or multiple layers of SiNx and SiOx.

The semiconductor layer 112 is positioned on the buffer layer 111. The semiconductor layer 112 is positioned in the display area AA and has a source region, a channel region and a drain region. The semiconductor layer 112 may be formed of an organic semiconductor material, an oxide semiconductor material or a silicon semiconductor material.

The gate insulating layer 113 is positioned on the semiconductor layer 112. The gate insulating layer 113 is formed to cover the channel region of the semiconductor layer 112 positioned in the display area AA. The gate insulating layer 113 may be formed of a single layer of SiNx or SiOx or multiple layers of SiNx and SiOx.

The gate metal layer 114 is positioned on the gate insulating layer 113. The gate metal layer 114 is formed having a size corresponding to the size of the gate insulating layer 113. The gate metal layer 114 becomes the gate electrode of the transistor TFT. In addition, the gate metal layer 114 is used as a metal layer forming scan lines. The gate metal layer 114 may be formed of one selected from a group consisting of Mo, Al, Cr, Au, Ti, Ni and Cu or an alloy thereof and may be formed as a single layer or multiple layers.

The interlevel insulating layer 115 is positioned on the gate metal layer 114. The interlevel insulating layer 115 may be formed of a single layer of SiNx or SiOx or multiple layers of SiNx and SiOx. The interlevel insulating layer 115 exposes the source region and the drain region of the semiconductor layer 112.

The data metal layers 116a, 116b and 116c are positioned on the interlevel insulating layer 115. The data metal layers 116a, 116b and 116c include first and second data metal layers 116a and 116b isolated and respectively connected to the source region and the drain region of the semiconductor layer 112 in the display area AA, and a third data metal layer 116c isolated and disposed in the pad area PA. The first and second data metal layers 116a and 116b become first and second electrodes of the transistor TFT and the third data metal layer 116c becomes an electrode of the pad part PAD. The data metal layers 116a, 116b and 116c may be formed of one selected from a group consisting of Mo, Al, Cr, Au, Ti, Ni and Cu or an alloy thereof and may be formed as a single layer or multiple layers.

The cover layers 117a, 117b and 117c are positioned on the data metal layers 116a, 116b and 116c. The cover layers 117a, 117b and 117c are patterned corresponding to the data metal layers 116a, 116b and 116c to cover and protect the data metal layers 116a, 116b and 116c which have been patterned to be isolated and disposed in the display area AA and the pad area PA. Differently from the first and third cover layers 117a and 117c, the second cover layer 117b is patterned to cover the channel region as well as the second data metal layer 116b. The cover layers 117a, 117b and 117c may be formed of oxide such as ITO (Indium Tin Oxide) or IZO (Indium Zinc Oxide). The cover layers 117a, 117b and 117c may be omitted or replaced by a passivation layer due to process characteristics.

The planarization layer 118 is positioned on the cover layers 117a and 117b. The planarization layer 118 may further be positioned on the cover layer 117c, or it may be omitted from over the cover layer 117c, as shown. The planarization layer 118 planarizes the surface of structures including the transistor TFT formed thereunder and thus is positioned in the display area AA. The planarization layer 118 may be formed of an organic material such as a negative overcoat, polyimide, benzocyclobutene series resin or acrylate and photoacrylate. The planarization layer 118 has a first contact hole CH1 which exposes part of the second cover layer 117b (or part of the second data metal layer 116b) outside the opening OPN that defines the emission area of the sub-pixel (in a non-opening region adjacent to the opening). That is, in the display panel shown in FIG. 19, the first contact hole CH1 may be formed through the planarization layer 118 in a region that is spaced apart laterally from the opening OPN.

The sacrificial layer 119 is positioned on the planarization layer 118. The sacrificial layer 119 is positioned in the display area AA and the pad area PA. In the pad area PA, the sacrificial layer 119 may be positioned, for example, on the interlevel insulating layer 115, as shown. The sacrificial layer 119 positioned in the display area AA has an opening wider than the opening OPN defining the emission area of the sub-pixel. The sacrificial layer 119 positioned in the display area AA exposes part of the planarization layer 118 through the opening in the sacrificial layer 119 which is wider than the opening OPN. The sacrificial layer 119 positioned in the pad area PA has a pad open region PO that exposes part of the third cover layer 117c (or part of the third data metal layer 116c).

The isolation layer 120 is positioned on the sacrificial layer 119. The isolation layer 120 is positioned in the display area AA and the pad area PA. The isolation layer 120 positioned in the display area AA has the opening OPN defining the emission area of the sub-pixel. The isolation layer 120 positioned in the display area AA exposes part of the planarization layer 118 through the opening OPN. The isolation layer 120 positioned in the pad area PA defines the pad open region PO along with the sacrificial layer 119 positioned in the pad area PA. The isolation layer 120 may be formed of a silicon-group material, for example, siloxane.

The lower electrode layer 121 is positioned on the isolation layer 120. The lower electrode layer 121 is selected as an anode of an organic light-emitting diode OLED. The lower electrode layer 121 positioned in the display area AA is formed to cover the planarization layer 118 and the isolation layer 120. The lower electrode layer 121 positioned in the display area AA is electrically connected to part of the second cover layer 117b (or part of the second data metal layer 116b) through the first contact hole CH1 of the planarization layer 118. The lower electrode layer 121 positioned in the display area AA has a structure in which the portion positioned on the planarization layer 118 is electrically isolated from the portion positioned on the isolation layer 120 according to an under-cut structure provided by the sacrificial layer 119 and the isolation layer 120. That is, the lower electrode layer 121 is divided into the portion positioned on the isolation layer 120 of the display area AA and the portion positioned on the planarization layer 118 exposed through the opening OPN. These portions are electrically and physically isolated from each other. The lower electrode layer 121 of the pad area PA is positioned on the isolation layer 120 but exposes the pad open region PO.

The organic emission layer 122 is positioned on the lower electrode layer 121. The organic emission layer 122 is formed of a material that emits white light but may be formed of a material that emits red, green or blue light according to circumstances (e.g., when a color filter is not provided).

The upper electrode layer 123 is positioned on the organic emission layer 122. The upper electrode layer 123 is selected as a cathode of the organic light-emitting diode OLED. The upper electrode layer 123 is formed to cover the entire organic emission layer 122. The upper electrode layer 123 is electrically connected to a second power line positioned in the display area AA or a non-display area. The lower electrode layer 121, the organic emission layer 122 and the upper electrode layer 123 form the organic light-emitting diode OLED.

The color filter layer CF is positioned on the upper substrate 110b (e.g., on the side facing the lower substrate). The color filter layer CF contains a pigment that can convert light generated from the organic emission layer 122 into one of red, green and blue colors. The color filter layer CF is formed to occupy an area wider than the opening OPN defined on the lower substrate 110a.

The black matrix layer BM is positioned on the upper substrate 100b (e.g., on the side facing the lower substrate). The black matrix layer BM is positioned between neighboring color filters CF in order to block light leak at the boundary of sub-pixels (non-opening region) and to prevent color mixture of adjacent color filters CF. The black matrix layer BM contains a pigment in black.

As described above, the present disclosure can omit fabrication of the bank layer and reduce the number of masks used when a top emission type display panel is manufacture to simplify the manufacturing process and to decrease manufacturing cost. In addition, the present disclosure can increase the aperture ratio and the life of the display panel. Furthermore, the present disclosure can selectively add one or more of the functions of condensing, reflecting and projecting the light emitted from the organic emission layer to improve display quality.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A light-emitting display device, comprising:
   a first substrate;
   a transistor positioned on the first substrate;
   a planarization layer positioned on the transistor;
   a sacrificial layer positioned directly on and in contact with the planarization layer;
   an isolation layer positioned on the sacrificial layer, part of the planarization layer being exposed by an opening that extends through the isolation layer and the sacrificial layer;
   a lower electrode layer having a first portion positioned on the isolation layer and a second portion positioned on the planarization layer in the opening;
   an organic emission layer positioned on the first and second portions of the lower electrode layer; and
   an upper electrode layer positioned on the organic emission layer,
   wherein a first contact hole extends through the part of the planarization layer in the opening, and the lower electrode layer is electrically connected to one electrode of the transistor through the first contact hole, and
   a portion of the lower electrode layer that is formed at an edge of the isolation layer that is adjacent to the opening is thinner than a portion of the lower electrode layer that is formed at a top of the isolation layer.

2. The light-emitting display device according to claim 1, wherein the sacrificial layer is recessed laterally with respect to the edge of the isolation layer at the opening, thereby forming an under-cut region between a lower surface of the isolation layer and the planarization layer.

3. The light-emitting display device according to claim 2, wherein a portion of the organic emission layer on the first portion of the lower electrode layer is connected to another portion of the organic emission layer on the second portion of the lower electrode layer.

4. The light-emitting display device according to claim 3 wherein the organic emission layer extends at least partially into the under-cut region.

5. The light-emitting display device according to claim 2, wherein a portion of the organic emission layer on the first portion of the lower electrode layer is isolated from another portion of the organic emission layer on the second portion of the lower electrode layer.

6. The light-emitting display device according to claim 1, wherein an upper surface of the isolation layer curves downwardly from the top portion to the edge of the isolation layer at the opening.

7. The light-emitting display device according to claim 6, wherein the curved upper surface intersects a lower surface of the isolation layer at the edge of the isolation layer.

8. The light-emitting display device according to claim 1, wherein the transistor comprises:
   a semiconductor layer positioned on the lower substrate;
   a gate insulating layer positioned on the semiconductor layer;
   a gate metal layer positioned on the gate insulating layer;
   an interlevel insulating layer positioned on the gate metal layer and exposing a source region and a drain region of the semiconductor layer;
   first and second data metal layers positioned on the interlevel insulating layer and isolated from each other, the first and second data metal layers respectively connected to the source region and the drain region of the semiconductor layer; and
   first and second cover layers isolated from each other and respectively positioned on the first and second data metal layers.

9. The light-emitting display device according to claim 8, wherein the second cover layer covers the second data metal layer and a channel region of the semiconductor layer.

10. The light-emitting display device according to claim 1, wherein the second portion of the lower electrode layer is directly on and in contact with the planarization layer in the opening.

11. The light-emitting display device according to claim 1, wherein the first portion of the lower electrode layer extends continuously from the top portion of the isolation layer to the edge of the isolation layer.

12. The light-emitting display device according to claim 11, wherein the organic emission layer extends continuously between the edge of the isolation layer and an upper surface of the second portion of the first electrode in the opening, the organic emission layer at least partially filling a space between the second portion of the first electrode and a lower surface of the isolation layer.

13. A light-emitting display device, comprising:
   a display panel including a plurality of sub-pixels, each of the sub-pixels having a transistor and an organic light-emitting diode;
   an opening that defines an emission area of a sub-pixel of the plurality of sub-pixels;
   a first contact hole positioned in the opening, one electrode of the transistor being electrically connected to a lower electrode layer of the organic light-emitting diode in the first contact hole;
   a planarization layer on the transistor;
   a sacrificial layer directly on and in contact with the planarization layer;
   an isolation layer on the sacrificial layer;
   a lower electrode layer having a first portion positioned on the isolation layer and a second portion positioned on the planarization layer in the opening, the first portion of the lower electrode covering the isolation layer from a top portion to an edge of the isolation layer at the opening;
   an organic emission layer positioned on the first and second portions of the lower electrode layer; and
   an upper electrode layer positioned on the organic emission layer,
   wherein the opening extends through the isolation layer and the sacrificial layer,
   wherein the organic emission layer extends continuously between the edge of the isolation layer and an upper surface of the second portion of the lower electrode in the opening, the organic emission layer at least partially filling a space between the second portion of the lower electrode and a lower surface of the isolation layer, and
   wherein a portion of the isolation layer adjacent to the opening has a curved shape.

14. The light-emitting display device according to claim 13 wherein the portion of the isolation layer has a hemispherical shape in a cross-sectional view.

15. A method of manufacturing a light emitting display device, the method comprising:
   forming a transistor in a display area on a first substrate;
   forming a planarization layer on the transistor;
   forming a sacrificial layer directly on and in contact with the planarization layer;
   forming an isolation layer on the sacrificial layer;
   forming an opening that extends through the isolation layer and the sacrificial layer;
   forming a lower electrode layer with a mask that exposes an overall surface of the display area aligned on the first substrate;
   forming an organic emission layer on the lower electrode layer; and
   forming an upper electrode layer on the organic emission layer,
   a portion of the lower electrode layer that is formed at an edge of the isolation layer that is adjacent to the opening is thinner than a portion of the lower electrode layer that is formed at a top of the isolation layer, wherein an upper surface of the isolation layer curves downwardly from the top of the isolation layer to the edge of the isolation layer at the opening.

16. The method according to claim 15, wherein forming the lower electrode layer includes forming a first portion of the lower electrode layer on the isolation layer, and forming a second portion of the lower electrode layer on the planarization layer in the opening, wherein the first portion of the lower electrode layer corresponds to a non-opening region within the display area.

17. The method according to claim 15, wherein a portion of the isolation layer adjacent to the opening has a hemispherical shape in a cross-sectional view.

* * * * *